(12) United States Patent
Lin et al.

(10) Patent No.: US 9,299,448 B2
(45) Date of Patent: Mar. 29, 2016

(54) WIDE BANDWIDTH READ AND WRITE MEMORY SYSTEM AND METHOD

(75) Inventors: Kenneth Chenghao Lin, Shanghai (CN); Bingchun Zhang, Shanghai (CN)

(73) Assignee: SHANGHAI XIN HAO MICRO ELECTRONICS CO. LTD., Shanghai (CN)

( * ) Notice: Subject to any disclaimer, the term of this patent is extended or adjusted under 35 U.S.C. 154(b) by 783 days.

(21) Appl. No.: 13/518,883

(22) PCT Filed: Dec. 28, 2010

(86) PCT No.: PCT/CN2010/080378
§ 371 (c)(1),
(2), (4) Date: Jun. 23, 2012

(87) PCT Pub. No.: WO2011/079780
PCT Pub. Date: Jul. 7, 2011

(65) Prior Publication Data
US 2012/0265951 A1    Oct. 18, 2012

(30) Foreign Application Priority Data

Dec. 28, 2009  (CN) .......................... 2009 1 0247456

(51) Int. Cl.
| G06F 13/00 | (2006.01) |
| G11C 16/26 | (2006.01) |
| G11C 16/08 | (2006.01) |
| G11C 16/10 | (2006.01) |
| G11C 7/10  | (2006.01) |
| G11C 8/16  | (2006.01) |
| G11C 11/419 | (2006.01) |

(52) U.S. Cl.
CPC *G11C 16/26* (2013.01); *G11C 7/10* (2013.01); *G11C 7/1075* (2013.01); *G11C 8/16* (2013.01); *G11C 11/419* (2013.01); *G11C 16/08* (2013.01); *G11C 16/10* (2013.01)

(58) Field of Classification Search
CPC combination set(s) only.
See application file for complete search history.

(56) References Cited

U.S. PATENT DOCUMENTS

| 4,541,075 A * | 9/1985 | Dill et al. ................. 365/189.04 |
| 4,933,909 A * | 6/1990 | Cushing et al. .......... 365/230.05 |
| 5,422,858 A * | 6/1995 | Mizukami et al. ....... 365/233.12 |
| 6,288,970 B1 * | 9/2001 | Reddy et al. ............. 365/230.05 |
| 6,359,813 B1 * | 3/2002 | Uchida et al. ............ 365/189.05 |
| 2005/0213419 A1 * | 9/2005 | Miyamoto ............... 365/230.03 |
| 2007/0109909 A1 * | 5/2007 | Jung ........................... 365/233.5 |
| 2008/0052565 A1 * | 2/2008 | Oku ............................... 714/702 |

* cited by examiner

*Primary Examiner* — Charles Rones
*Assistant Examiner* — Han Doan
(74) *Attorney, Agent, or Firm* — Anova Law Group, PLLC (57) ABSTRACT

A memory device includes a first memory array, a first read port, a second read port, and a control input port. The first memory array contains a plurality of memory cells arranged in an array configuration. The first read port is configured to read first data from a single memory cell during a single read cycle, and the second read port is configured to read second data from a group of memory cells controlled by a common word line. Further, the control input is configured to receive a mode signal indicating a functional mode for the memory device including a first read mode and a second read mode. When the mode signal indicates the first read mode, the first read port is used to read the first data. When the mode signal indicates the second read mode, the first read port is used to read out the first data and the second read port is used to read the second data.

12 Claims, 8 Drawing Sheets

WIDE BANDWIDTH READ AND WRITE MEMORY SYSTEM AND METHOD

TECHNICAL FIELD

The present invention generally relates to the field of integrated circuit memory devices and, more particularly, to systems, devices and methods to enhance read/write bandwidth for memory arrays

BACKGROUND ART

The scale of memory arrays has dramatically increased with technology progresses and increasing demands over the past few decades. In a conventional memory array, the readout circuit may occupy a significant portion of the entire chip area. In order to simplify the readout circuit, a number of columns are grouped as a logic column, and therefore a number of adjacent memory cells on one row are normally grouped together into a memory cell unit to share one word line or one X address. Write or read operations are performed on one single memory cell per cell unit in each clock cycle in the conventional memory array. For example, a 512×32 static random access memory (SRAM) normally consists of 128 rows, each of which includes 128 SRAM cells grouped into 32 memory cell units. That is, one memory cell unit corresponds to every four SRAM cells, and the four SRAM cells share one readout circuit.

During a write operation, an address decoder in an SRAM array receives row and column addresses over the address bus, and decodes the row addresses to enable a word line. Data on an input data port is written into one SRAM cell within a cell unit identified by the input column address while the data in the other three SRAM cells in the same memory cell unit remain the same. During a read operation, bit lines of all columns are first pre-charged, while the address decoder decodes the received addresses for the read operation. Once the address decoder completes address decoding, one word line is selected to connect the contents of one row of cell units to the bit lines while the pre-charging is terminated. Bit lines of one of the four columns are selected by the column address and then are sensed and amplified, thus completing a read operation.

DISCLOSURE OF INVENTION

Technical Problem

However, a conventional SRAM array having one set of address decoders can only complete one write or one read operation in one clock cycle. Multiple-port SRAM can complete multiple write and/or read operations in one clock cycle. However, the enhanced multiple read/write capability often increases the number of word lines and bit lines, SRAM cell area, control circuit complexity, design cost, and manufacturing cost. For example, the area size of a dual port SRAM cell array normally doubles the area size of a single port SRAM cell array.

Similar problems also exist in other types of memory arrays that employ word lines and bit lines to access the memory cells. The disclosed methods and systems are directed to solve one or more problems set forth above and other problems.

Technical Solution

One aspect of the present disclosure includes a memory device. The memory device includes a first memory array, a first read port, a second read port, and a control input port. The first memory array contains a plurality of memory cells arranged in an array configuration. The first read port is configured to read first data from a single memory cell during a single read cycle, and the second read port is configured to read second data from a group of memory cells controlled by a common word line. Further, the control input is configured to receive a mode signal indicating a functional mode for the memory device including a first read mode and a second read mode. When the mode signal indicates the first read mode, the first read port is used to read out the first data. When the mode signal indicates the second read mode, the first read port is used to read out the first data and the second read port is used to read out the second data.

Another aspect of the present disclosure includes a memory device. The memory device includes a memory array, a first write port, a second write port, and a control input port. The memory array is configured to contain a plurality of memory cells arranged in an array configuration. The first write port is configured to write first data into a single memory cell during a single writing cycle, and the second write port is configured to write second data into a group of memory cells controlled by a common word line during the single writing cycle. Further, the control input port is configured to receive a mode signal indicating a functional mode for the memory device including a first write mode and a second write mode. When the mode signal indicates the first write mode, the first write port is used to write the first data; when the mode signal indicates the second write mode, the second write port is used to write the second data.

Another aspect of the present disclosure includes a method for pseudo dual port memory operation of a memory device including a memory array. The memory array contains a plurality of memory cells arranged in an array configuration. The method includes providing a first address for a first operation and a second address for a second operation during a single clock cycle, and providing a first enable signal to control a first group of memory cells to start the first operation based on the first address. The method also includes latching results from the first operation, providing a control signal to switch from the first operation to the second operation, and providing a second enable signal to control a second group of memory cells to start the second operation based on the second address.

Another aspect of the present disclosure includes a static random access memory (SRAM) device. The SRAM device includes a memory array, an address decoder, a read/write control module, a write module, and a read module. The memory array is configured to receive word lines and bit lines, the memory array comprising a first number of rows and a second number of columns of memory cells, each row being controlled by a word line, each column being connected by a bit line and a complementary bit line, every third number of adjacent columns being grouped as a logical column corresponding to a bit of data and every third number of adjacent memory cells on one row being grouped as a memory cell unit. The address decoder is configured to receive an address bus and to generate a word line and a column select signal. Further, the read/write control module configured to receive control signals to generate a write mode control, a write enable and a read enable. The write module is configured to receive the write mode control, the write enable, the column address, a first write input and a second write input and to connect to drive the bit lines and complementary bit lines, the write module selects one or more sets of the third number of bit lines and complementary bit lines in every logic column to be written. The read module is configured to receive the read enable, the column address, the bit lines and the complementary bit lines and to generate a first read output and a second read output, the read module multiplexing the third number of bit lines and complementary bit lines in every logic column.

Other aspects of the present disclosure can be understood by those skilled in the art in light of the description, the claims, and the drawings of the present disclosure.

Advantageous Effects

The disclosed systems and methods may significantly enhance read/write bandwidth for memory arrays by using additional input and output ports at the memory peripheral and utilizing the bit lines. The disclosed systems and methods also provides a performance similar to that of the conventional two-port memory at a chip-area cost similar to that of the conventional one-port memory. Other advantages and applications are obvious to those skilled in the art.

BEST MODE

Figure 1:
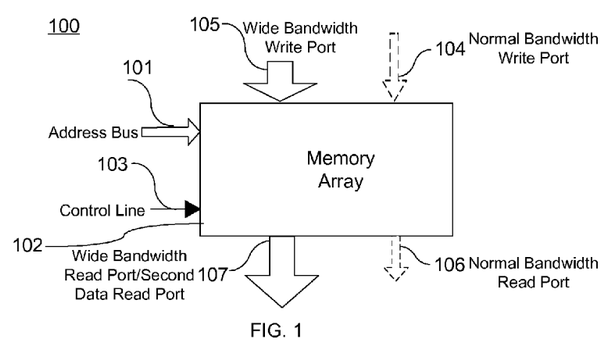
FIG. 1 illustrates an exemplary block diagram of an input/output interface for a memory array consistent with the disclosed embodiments.
Figure 1A:
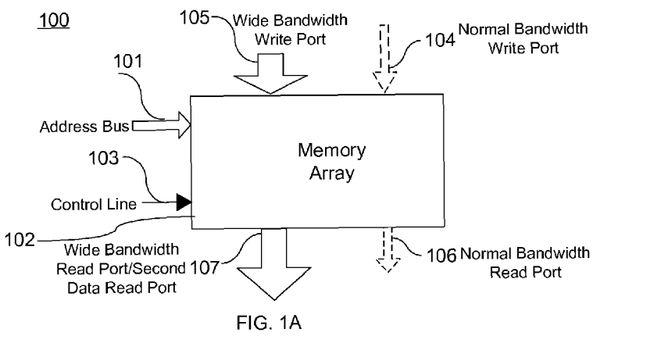
FIG. 1A illustrates an exemplary block diagram of an input/output interface for a memory array consistent with the disclosed embodiments.
Figure 1B:
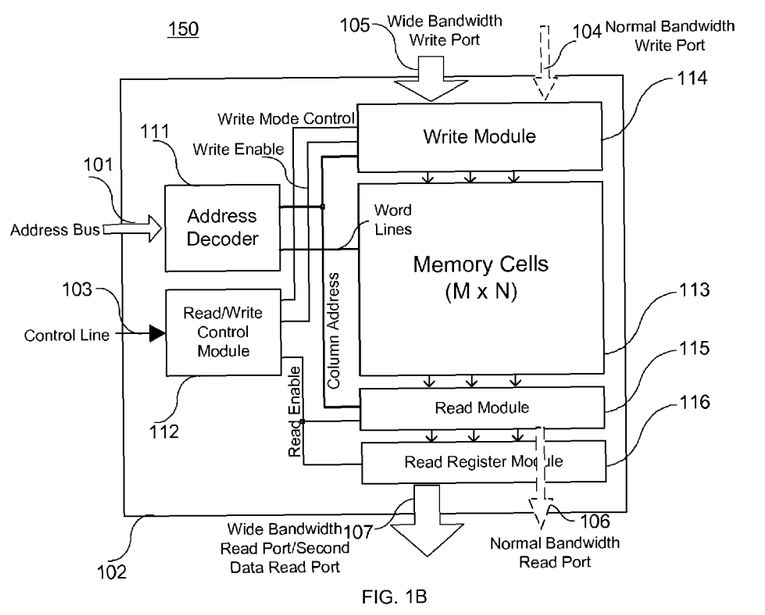
FIG. 1B illustrates an exemplary block diagram of a memory array with enhanced bandwidth consistent with the disclosed embodiments.

FIG. 1B illustrates an exemplary preferred embodiment(s).

Mode for Invention

Reference will now be made in detail to exemplary embodiments of the invention, which are illustrated in the accompanying drawings. Wherever possible, the same reference numbers will be used throughout the drawings to refer to the same or like parts. The embodiments are used to explain the invention and not to limit the invention. One skilled in the art will exchange, adjust and improve the specific embodiments; however, these exchanges, adjustments and improvements will be included as part of the invention.

FIG. 1 and FIG. 1A illustrates an exemplary block diagram 100 of an input/output interface for a memory array 102 involving additional input/output ports to enhance the bandwidth for memory write and read operations. As shown in FIG. 1 and FIG. 1A, an address bus 101 provides the memory array 102 with row and column addresses for write or read, and a control line 103 is used to control operations (write or read) and function modes (normal or wide bandwidth). A normal bandwidth write port 104 is used to input data for write in a normal bandwidth write mode, and a wide bandwidth write port 105 is used to input multiple data for parallel writes in a wide bandwidth write mode. Similarly, the data in the memory array 102 are read out through a normal bandwidth read port 106 in a normal bandwidth read mode, and through a wide bandwidth read port 107 or a second data read port in a wide bandwidth read mode. The bandwidths for read and write operations are enhanced due to the use of the wide bandwidth write and read ports 105 and 107.

FIG. 1B illustrates an exemplary block diagram 150 of a memory array with enhanced read and write bandwidths in certain implementations. In addition to the input/output ports in FIG. 1A, the memory array 102 further comprises of an address decoder 111, a read/write control module 112, a write module 114, memory cells 113, a read module 115 and a read register module 116. The address decoder 111 receives addresses from the address bus 101, drives the word line and delivers the column addresses to the write module 114 and the read module 115 and read register module 116. The read/write control module 112 comprises an optional sequential control module, a write control module and a read control module (not shown). Read/write control module 112 receives the control line 103, and generates a read enable, a write enable and a write mode control. The write module 114 may receive the write enable, write mode control and column address; and deliver the data input from the normal bandwidth write port 104 or wide bandwidth write port 105 to a selected memory cell or selected memory cells. The read module 115 may receive the read enable and column address, and deliver data in a selected memory cell or selected memory cells directly to the normal bandwidth read port 106 or the read register module 116. The read register module 116 may temporarily store the data and deliver the data to the wide bandwidth read port or second data read port 107.

To enhance the write bandwidth, the exemplary memory array 150 is written in by two aforementioned write modes, the normal bandwidth write mode and the wide bandwidth write mode. In the normal bandwidth write mode, data coming from the normal bandwidth write port 104 is written to a SRAM cell selected by input row and column addresses. Three unselected SRAM cells in the same memory cell unit have high impedance, and their internal data will not be overwritten. However, in the wide bandwidth write mode, write module 114 allows the data in four SRAM cells included in one memory cell unit to be refreshed simultaneously. Although SRAM is used to illustrate various embodiments in this disclosure, other types of memory can also be used without departing the principles of the disclosed embodiments.

To enhance the read bandwidth, the exemplary memory array 150 is also read out by two aforementioned read modes, normal bandwidth read mode and wide bandwidth read mode. The read module 115 comprises low-speed read (sensing) modules and a high-speed read (sensing) module (not shown). The high-speed read module requires significantly more chip area than the low-speed read module. Bit lines of each individual SRAM cell are connected with its own low-speed read module for reading multiple SRAM cells in parallel at a relatively low speed, and four SRAM cells in a memory cell unit share a high-speed read module for reading out one of the SRAM cells at a faster speed. In the normal bandwidth read mode, the high-speed read module first senses and amplifies data from one SRAM cell as specified by the column address. The data are outputted to the normal bandwidth read port 106. In the wide bandwidth read mode, at first the high-speed read module outputs the data in the selected SRAM cell to the normal bandwidth read port 106. Then the data in the other unselected SRAM cells are outputted in parallel to the wide-bandwidth read port 107 using their own low-speed read sensing modules. Alternatively, the data in the unselected SRAM cells are stored in the read register module 116 and ready for output sequentially through the second data read port 107 while another row is being read and outputted to normal bandwidth read port 106 in the normal bandwidth read mode. Therefore, by using two read ports, an equivalent configuration of pseudo dual read port memory is formed with a single port memory array to enhance the read bandwidth.

Figure 2:
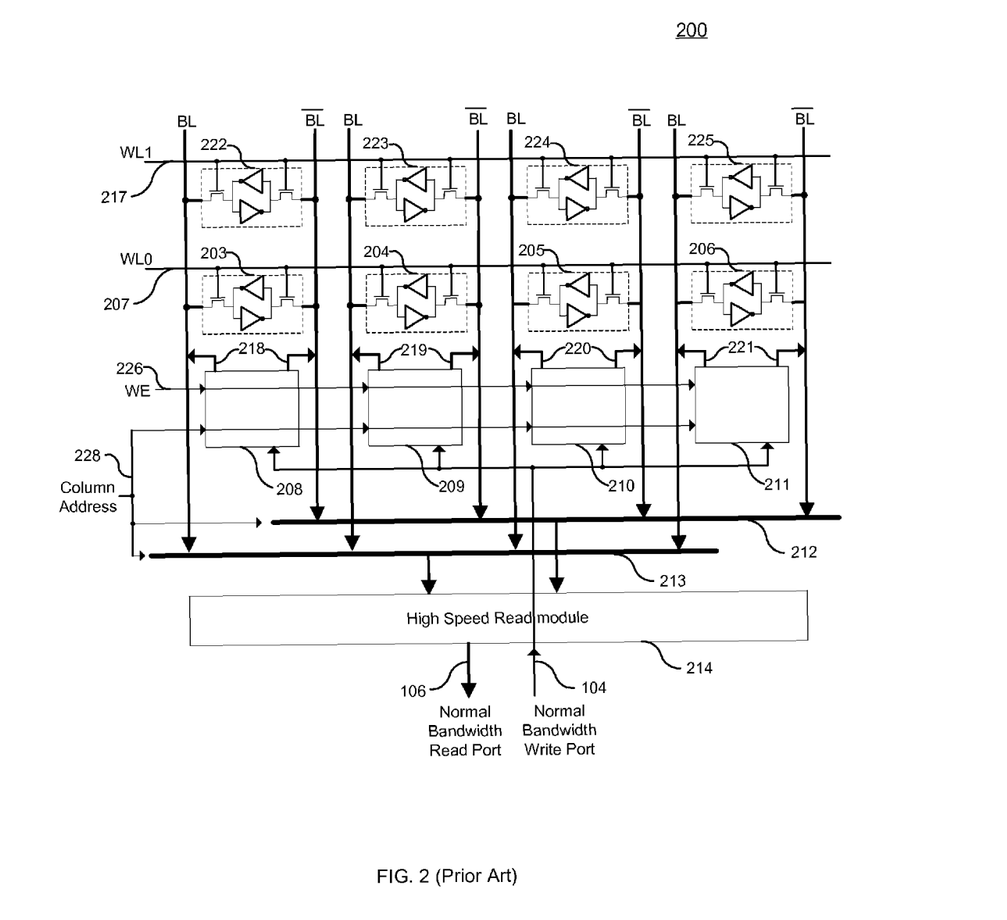
FIG. 2 illustrates a block diagram of an SRAM array allowing one-bit read/write operation.

FIG. 2 illustrates a block diagram 200 of a conventional SRAM array allowing one-bit read/write operation. SRAM cells 203, 204, 205 and 206 on four different columns are controlled by one common word line WL0 207, and SRAM cells 222, 223, 224 and 225 on four different columns are controlled by another common word line WL1 217.

During a write cycle, a write-enable signal WE 226 is enabled, and data are written into a memory cell selected by a column address 228. The column address of "00" selects the SRAM cells 203 or 222; the column address of "01" selects the SRAM cells 204 or 223; the column address of "10" selects the SRAM cells 205 or 224; and the column address of "11" selects the SRAM cells 206 or 225. In particular, data are inputted to write modules 208, 209, 210 and 211 through the normal bandwidth write port 104, and further passed to the set of bit lines BL and BL_N (i.e. bit line bar, the differential signal of BL, as indicated by 218 in FIG. 2 together with the bit line BL) selected by the column address 228 while the unselected three sets of bit lines BL and BL_N are kept high-impedance. For example, when the column address is "01", data are sent to the bit lines 219 which are connected to the SRAM cells 223 and 204, and the other bit lines 218, 220 and 221 are kept as high-impedance. If WL0 207 is enabled, the data are written into the SRAM cell 204 and the data in all the other SRAM cells remain the same.

During a read cycle, if one of the word lines WL1 217 and WL0 207 is enabled, the decoders 212 and 213 receive the column address 228 and select one of the four SRAM cells in the corresponding row. The data in the selected SRAM cell is read out by the high speed readout module 214 and output to a normal bandwidth output port 106.

Figure 3A:
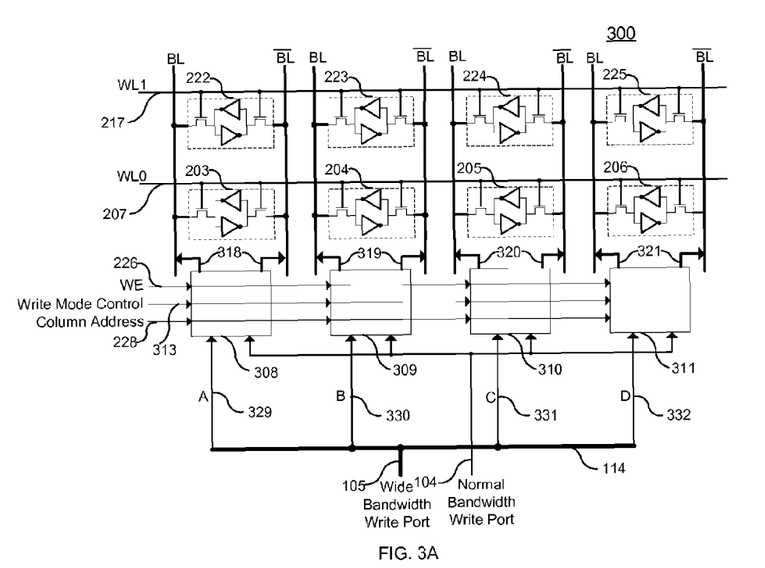
FIG. 3A illustrates an exemplary block diagram of a SRAM array performing a write operation consistent with the disclosed embodiments.

FIG. 3A illustrates an exemplary block diagram 300 of a SRAM array which performs a write operation based on one bit of input data. Although FIG. 3A and/or other figures in this disclosure use a same number or label to refer a device or component shown in a conventional device, it is understand that the device or component described in the disclosed embodiments is for the convenience of illustration and is not necessarily identical to the ones shown in the conventional device. As shown in FIG. 3A, SRAM cells 203, 204, 205 and 206 on four different columns are controlled by one common word line WL0 207, and SRAM cells 222, 223, 224 and 225 on four different columns are controlled by another common word line WL1 217. Data are written into a memory cell selected by a column address 228. The column addresses of "00", "01", "10", and "11" select SRAM cells 203 or 222, 204 or 223, 205 or 224, and 206 or 225, respectively. A write enable 226 and a write mode control 313 are generated by a write control logic in the read/write control module 112. In a write operation, the write enable WE 226 is first enabled, and the write mode control 313 is used to select the write mode as the normal bandwidth write mode or the wide bandwidth write mode. The write module 114 includes write modules 308, 309, 310 and 311.

In the normal bandwidth write mode, one bit of data are inputted to one of the write modules 308, 309, 310 or 311 through a normal bandwidth write port 104 during each write cycle. Data are further written to the set of bit lines BL and BL_N selected by the column address 228 while the unselected three sets of bit lines BL and BL_N are connected as high-impedance. In certain embodiments, the word line WL0 207 is selected and the column address is "01". Data are sent to the bit lines 319 which are connected to the memory cells 223 and 204, and the other bit lines 318, 320 and 321 are connected as high-impedance. When WL0 is enabled, the data are written into the SRAM cell 204, and the data in all the other SRAM cells remain the same.

In the wide bandwidth write mode, four bits of data are provided to the write modules 308, 309, 310 and 311, respectively, from a wide bandwidth write port 105. Column address 228 is not used in this mode. Four bits of data are sent to the bit lines 318, 319, 320 and 321 through line A (329), line B (330), line C (331), and line D (332), respectively. In one embodiment, the word line WL0 207 is enabled, the data are written in parallel into the SRAM cells 203, 204, 205 and 206, and the data in SRAM cell 222, 223, 224 and 225 remain the same.

Figure 3B:
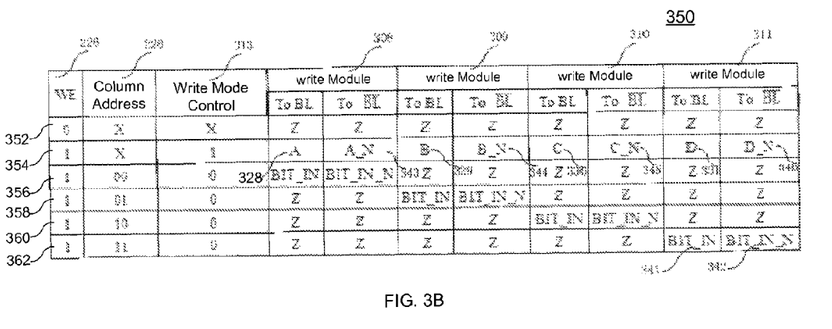
FIG. 3B illustrates a truth table for the write modules consistent with the disclosed embodiments.

FIG. 3B illustrates a truth table 350 for the write modules in FIG. 3A. In one embodiment as shown in row 352, the write enable WE 226 is disabled (i.e., WE 226 is "0"), and the outputs of the write modules 308, 309, 310, and 311 are all connected as high-impedance (Z). In another embodiment as shown in row 354, both the WE 226 and the write mode control 313 are enabled. The wide bandwidth write mode is activated (i.e., write mode control is '1'). Data and the complimentary data A 328 and A_N 343, B 329 and B_N 344, C 330 and C_N 345, and D 331 and D_N 346 are sent in parallel to the bit lines 318, 319, 320 and 321 that are connected to the write modules 308, 309, 310 and 311, respectively. In certain embodiments as shown in rows 356, 358, 360 and 362, the WE 226 is enabled, and the write mode control 313 is disabled. The normal bandwidth write mode is activated. When the column address 228 is "11" as shown in row 362, the data BIT_IN is inputted from the normal bandwidth write port 104. BIT_IN 341 and the complementary BIT_IN_N 342 are written to the set of bit lines BL and BL_N connected with the SRAM cells 225 and 206. Similarly, when the column address 228 is "00", "01" or "10" as shown in rows 356, 358 and 360, the data BIT_IN are inputted from the normal bandwidth write port 104, and BIT_IN and BIT_IN_N are written to the bit lines BL and BL_N connected with the SRAM cells 222 and 203, 223 and 204, or 224 and 205, respectively. Other unaddressed bit lines are kept in high-impedance Z.

Figure 4A:
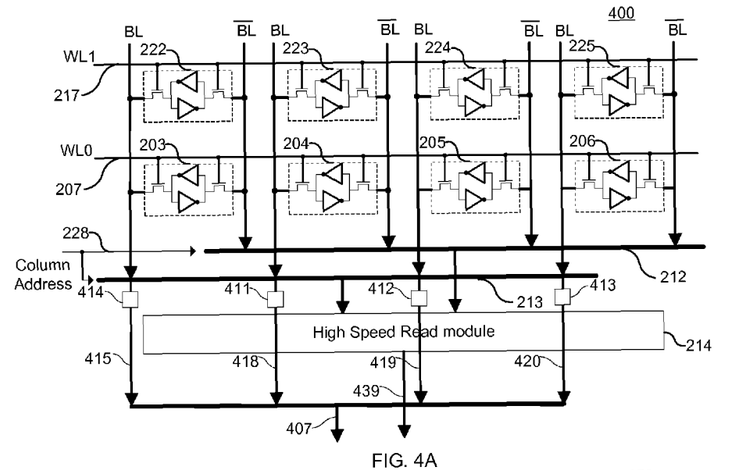
FIG. 4A illustrates an exemplary block diagram of the SRAM array in a Wide Bandwidth Read mode for a parallel read operation consistent with the disclosed embodiments.

FIG. 4A illustrates an exemplary block diagram 400 of the SRAM array in a wide bandwidth read mode for a parallel read operation. SRAM cells 203, 204, 205 and 206 on four different columns are controlled by one common word line WL0 207, and SRAM cells 222, 223, 224 and 225 on four different columns are controlled by another common word line WL1 217. All columns share a high-speed read module 214, and each column has its own separate low-speed read modules 411, 412, 413 and 414, respectively. The high-speed read module 214 consumes a larger chip area than the low-speed read modules 411, 412, 413 and 414 although the read speed of 214 is faster than that of the low-speed read modules. High-speed read module 214 and low-speed read modules 411, 412, 413 and 414 may be included in read module 115 (in FIG. 1B).

Data in SRAM cells on one row are read out within two clock cycles. In certain embodiments, high speed read module 214 is capable of finishing the read sensing of data on bit lines within the first clock cycle while the read process of low speed read modules 411, 412, 413 and 414 takes longer than one clock cycle and therefore may be completed in the second clock cycle. For example, data in the SRAM cell 203 are read out to normal bandwidth read port 439 (106 in FIG. 1) during the first clock cycle, and data in the SRAM cells 204, 205 and 206 are read out to the wide bandwidth read port 407 (107 in FIG. 1) during the second clock cycle.

More particularly, during the first clock cycle, the word line WL0 207 is enabled, and the bit lines of the SRAM cell 203 are selected by the multiplexers 212 and 213 as specified by the column address 228. Data in the SRAM cell 203 are directly read to the high speed read module 214, the sensed and amplified result is outputted on bus 439. While the data in the SRAM cell 203 is read by high speed read module 214, the data from the SRAM cells 203, 204, 205 and 206 are also sensed, and amplified by the low speed read modules 414, 411, 412, and 413.

During the second clock cycle, the word line WL0 207 remains enabled, the signals in the SRAM cells 203, 204, 205 and 206 are still sensed and amplified by the low-speed read modules 414, 411, 412 and 413 if the sensing process is not completed in the first clock cycle. By the end of the second clock cycle, the signals 415, 418, 419, and 420 are outputted in parallel to the wide bandwidth read port 407. Signal 415 may also be provided by read module 414 to the wide bandwidth read port 407, but may be ignored because the SRAM cell 203 is already read during the first clock cycle. In addition, similarly, data in each of SRAM cells 203, 204, 205, and 206 may also be read out through high speed read module 214 during the first clock cycles while the remaining data in remaining cells are read out in the second clock cycles.

Further, wide bandwidth read port 407 may be controlled by a read control module to output a particular signal 415, 418, 419, or 420. Alternatively, wide bandwidth read port 407 may provide all signals 415, 418, 419, and 420, and an outside multiplexer may be used to select a particular signal 415, 418, 419, or 420. Other configurations may also be used.

Figure 4B:
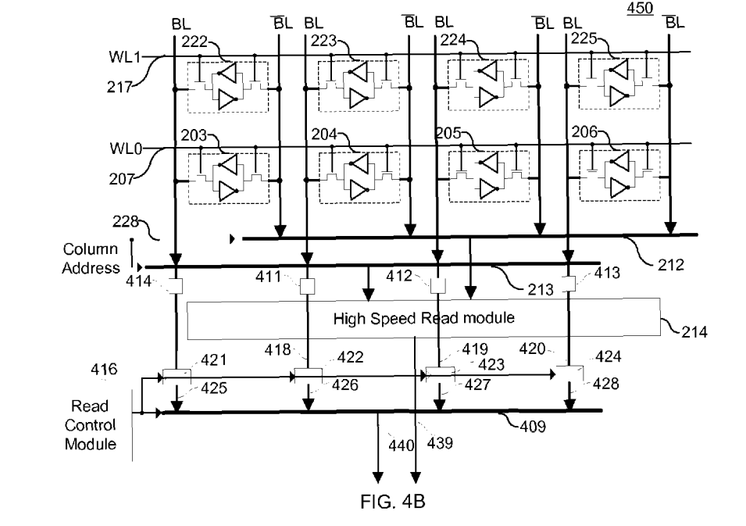
FIG. 4B illustrates an exemplary block diagram 450 of a SRAM array implemented in the Normal Bandwidth Read mode for sequential read operations consistent with the disclosed embodiments.

FIG. 4B illustrates an exemplary block diagram 450 of a SRAM array implemented in the wide bandwidth read mode for sequential read operations. SRAM cells 203, 204, 205 and 206 in four different columns are controlled by one common word line WL0 207, and SRAM cells 222, 223, 224 and 225 on four different columns are controlled by another common word line WL1 217. Similar to FIG. 4A, all columns share a high-speed read module 214, and each column has its separate low-speed read modules 411, 412, 413 and 414, respectively. The high speed read module 214 is capable of completing the read sensing of data on bit lines within a first clock cycle while the read process of low speed read modules 411, 412, 413 and 414 takes longer than one clock cycle and therefore may be completed in a second clock cycle. Latches 421, 422, 423, and 424 are provided to latch outputs from low speed read modules 411, 412, 413 and 414, respectively.

During the first clock cycle, the WL0 207 is enabled. The SRAM cell 203 is then selected by the column address 228 using the two-bit multiplexers 212 and 213, and the data in SRAM cell 203 is sent to the high speed read module 214 and the output signal is then provided to the normal bandwidth data port 439 (106 in FIG. 1). Thus, SRAM cell 203 is read out during the first clock cycle on normal bandwidth data port 439 (106 in FIG. 1). While the data in the SRAM cell 203 is read, the data from the SRAM cells 203, 204, 205 and 206 are also sensed, and amplified by the low speed read modules 414, 412, 412 and 413.

During the second clock cycle, the word line WL0 207 remains enabled, the signals in the SRAM cells 203, 204, 205 and 206 are still sensed and amplified by the low-speed read modules 414, 411, 412 and 413 if the sensing process is not completed in the first clock cycle. The read out data in the low-speed read modules 414, 411, 412 and 413 are held in the latches 421, 422, 423 and 424, respectively. The read control module 416 controls the multiplexer 409 to output the data held in latch 422 (content of memory cell 204) to a second data read port 440 (e.g., wide bandwidth read port 107 in FIG. 1). Thus, SRAM cell 204 is read out during the second clock cycle on second data read port 440 (i.e. wide bandwidth data port 107 in FIG. 1) through multiplexer 409 under the multiplexer control signal generated by read control module 416.

During the third clock cycle or a subsequent clock cycle, the WL0 207 is no longer enabled, and the read control module 416 controls the multiplexer 409 to output the data held by the latch 423 to the second data read port 440 directly. Thus, content of SRAM cell 205 is read out during the third clock cycle on second data read port 440 (i.e. wide bandwidth data port 107 in FIG. 1). At the same time, another word line (e.g., WL1 217) may be enabled and a second data from another SRAM cell on another row (e.g., SRAM cell 223) may be readout using high speed read module 214 to normal bandwidth data port 439 (i.e. 106 in FIG. 1). Thus, at the end of this clock cycle, data corresponding to two different addresses (cell 223 and cell 205) are presented at two separate ports simultaneously.

During the fourth clock cycle, the read control module 416 controls the multiplexer 409 to output the data (SRAM cell 206) in the latch 424 directly to the second data read port 440. Therefore, by the end of the fourth clock cycle, the data in the memory cells 203, 204, 205 and 206 are read out sequentially within four consecutive clock cycles from the normal bandwidth data port 439 (106 in FIG. 1) and the second data read port 440 (107 in FIG. 1).

More specifically, to take full advantage of the read bandwidth, the WL0 207 can be disabled in the third clock cycle, bit lines BL and BL_N may be pre-charged, and the next word line WL1 217 may be enabled. The SRAM cell 223 is then selected by the column address 228 using the multiplexer 212 and 213, and the data in the SRAM cell 223 are outputted to the high speed read module 214 and then to the normal bandwidth data port 439 (i.e. 106 in FIG. 1). Also, during the third clock cycle, one of the latched contents of individual SRAM cells 203, 204, 205 and 206 can be read out from the bus 440

(i.e. wide bandwidth data port 107 in FIG. 1) through multiplexer 409 under the multiplexer control signal generated by read control module 416. And contents of memory cell 222, 223, 224 and 225 are sensed and read by slow read modules 414, 411, 412 and 413, respectively at the same time.

During the fourth clock cycle, the WL1 217 remains enabled. The data sensing and reading of memory cells 222, 223, 224 and 225 are completed in the low-speed read modules 414, 411, 412 and 413. If the read control module 416 does not update the latches 421, 422, 423 and 424, then in fourth clock cycle and the next clock cycle or cycles, each data of memory cells 203, 204, 205 and 206 may be outputted to bus 440 (107 in FIG. 1) under the multiplexer 409 control signal generated by read control module 416. Alternatively, if read control module 416 updates the latches 421, 422, 423 and 424 to latch in the sensed and read memory contents of memory cells 222, 223, 224, and 225, then data of either memory cells 222, 223, 224 or 225 may be outputted to bus 440 (107 in FIG. 1) through multiplexer 409 under the multiplexer control signal generated by read control module 416. Thus, data are pipelined through both the wide bandwidth read port 107 and the normal bandwidth read port 106.

In addition to using more input/output ports, the write/read bandwidths are further enhanced by applying the sequential read/write control module which allows a write operation to follow a read operation within one clock cycle, thus may form pseudo dual read/write ports. All bit lines are pre-charged while the address decoder first decodes the read addresses. Upon generating the read addresses, the pre-charging is terminated and the word line is enabled. The read module captures the data and is then disconnected from the selected bit lines. While the read module goes on to amplify the captured data, the write-enable signal becomes valid and the write address is decoded to enable a word line for write. Data are written into the selected bit line by a write module. The write operation may be done to either the same cells on the same word line with the cells being read out or cells on different word lines. The read operation in the above-mentioned write-after-read operation can be substituted with another write operation, and thus two write operations in one clock cycle using the same or similar control mechanism.

Figure 5:
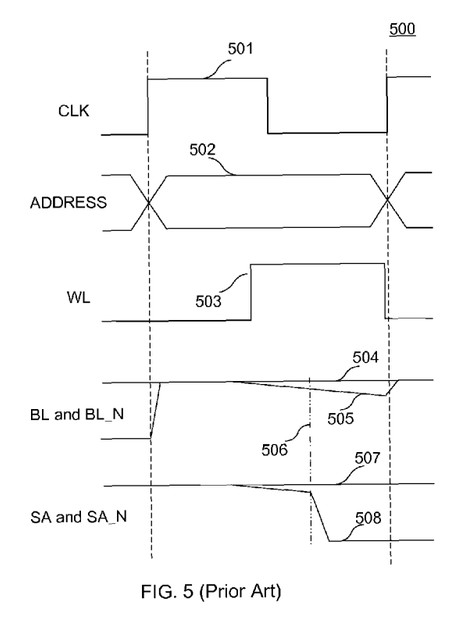
FIG. 5 illustrates a timing diagram 500 of SRAM controls and output signals in a clock cycle in an SRAM array.

FIG. 5 illustrates a timing diagram 500 of SRAM control signals and output signals in a clock cycle in the SRAM array as shown in FIG. 2. CLK 501 is a clock signal, and ADDRESS 502 is an address bus signal. WL 503 is the word line signal for the SRAM cells. WL 503 is enabled after the address decoder decodes ADDRESS 502 and is disabled at falling edge of the clock cycle CLK 501. Assuming the data contained in the SRAM cell is "1". Bit lines BL 504 and BL_N 505 are pre-charged to high till the ADDRESS 502 is decoded and the WL 503 is enabled. The BL remains at a high level while BL_N 505 is slowly pulled down by the content of the SRAM cell. A read circuit samples and amplifies the levels of the BL 504 and BL_N 505 at sampling time 506 to produce read out data SA 507 and SA_N 508. At the same time, the BL 504 and BL_N 505 are disconnected from the read circuit. A digital level of "high" is properly outputted from the signals SA 507 and SA_N 508.

Figure 6A:
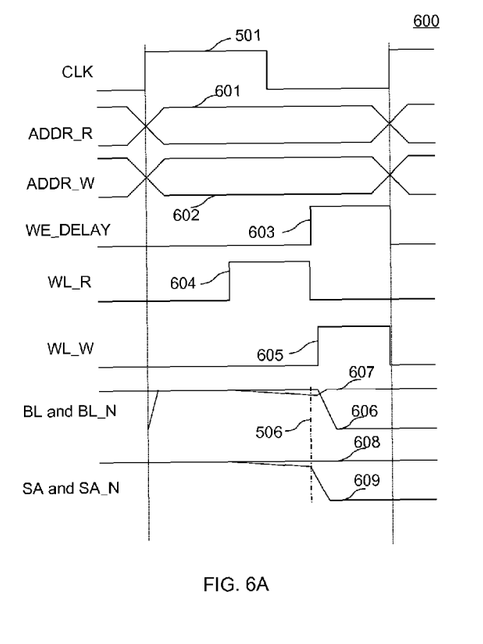
FIG. 6A illustrates an exemplary timing diagram of increasing write bandwidth by using two address decoders to add a sequential write operation during a read clock cycle consistent with the disclosed embodiments.

FIG. 6A illustrates an exemplary timing diagram 600 of increasing write bandwidth by using two address decoders to add a write operation in a read clock cycle such that a read operation and a write operation can be performed in one clock cycle. CLK 501 is the clock signal. ADDR_R 601 is a first address signal for the read operation. ADDR_W 602 is a second address signal for the write operation. WL_R 604 is a word line signal enabling a row of SRAM cells for read. WL_W 605 is a word line signal enabling a row of SRAM cells for write. WE_DELAY 603 is the write mode control signal. In one embodiment where data to be read is "1" and the data to be write is "0", BL 606 and BL_N 607 are pre-charged to "1" at the beginning of the read clock cycle, and the pre-charge completes before ADDR_R 601 is decoded and WL_R 604 is enabled. Data in BL_N 607 slowly drops in order to restore to "0". At a sampling time 506, the read module 214 senses and amplifies the data in the BL 606 and BL_N 607 to be SA 608 and SA_N 609, and then disconnect from the BL 606 and BL_N 607. Subsequently, WE_DELAY 603 is enabled and ADDR_W 601 has already been decoded. Data "0" and "1" to be written are sent to BL 606 and BL_N 607, respectively. The write drivers which drive the bit lines in this embodiment has both a pull up and pull down capability, thus the write action is not limited to after a bit lines pre-charging. BL 606 is immediately pulled down and BL_N 607 is pulled up. Read out data "1" has already been properly sampled, sensed and outputted from the SA 608, and the write-indata "0" is properly written to the BL 606 as well. The SRAM array can read data first and then write data. Alternatively, the read can also be replaced with a write so that two write operations happen sequentially, no bit liens pre-charging necessary between the two write actions, thus may form pseudo dual write ports.

FIG. 6A illustrates an exemplary timing diagram 600 of increasing write bandwidth by using two address decoders to add a write operation in a read clock cycle such that a read operation and a write operation can be performed in one clock cycle. CLK 501 is the clock signal. ADDR_R 601 is a first address signal for the read operation. ADDR_W 602 is a second address signal for the write operation. WE_DELAY 603 is the delay write enable control signal which enables the write word line after a certain delay in timing. WL_R 604 is a read word line for a row of SRAM cells being read. WL_R 604 is active after the decoding of the read address 601 and is disabled before WE_DELAY 603 is active. WL_W 605 is a word line signal selecting a row of SRAM cells for write. WL_W 605 is enabled after WE_DELAY 603 is active and is disabled before the next rising edge of CLK 501.

In one embodiment, where data to be read is "1" and the data to be write is "0", BL 606 and BL_N 607 are pre-charged to "1" at the beginning of the read clock cycle, and the pre-charge is completed before ADDR_R 601 is decoded and WL_R 604 is enabled. When WL_R 604 is active. BL_N 607 is slowly pulled down by memory cell controlled by WL_R 604. At sampling time 506, the read module 214 senses the data on BL 606 and BL_N 607 and later amplifies the data to be read out as "1" on SA and SA_N ports. Also, at sampling time the read module 214 are disconnected from the BL 606 and BL_N 607. Then, Data "0" and "1" are written on to BL 606 and BL_N 607, respectively. BL 606 is immediately pulled down and BL_N 607 is pulled up. WE_DELAY 603 enabled the word line WL_W 605 which is selected by the write address decoder through decoding ADDR_W 602. A data "0" is then stored on the memory cell on bit line BL 606 and BL_N607, which is enabled by word line WL_W 605. Thus, the SRAM array can read data first and then write data in the same clock cycle. Alternatively, the read operation can also be replaced by a write operation so that two write operations can be performed in the same clock cycle, thus may form pseudo dual write ports.

Figure 6B:
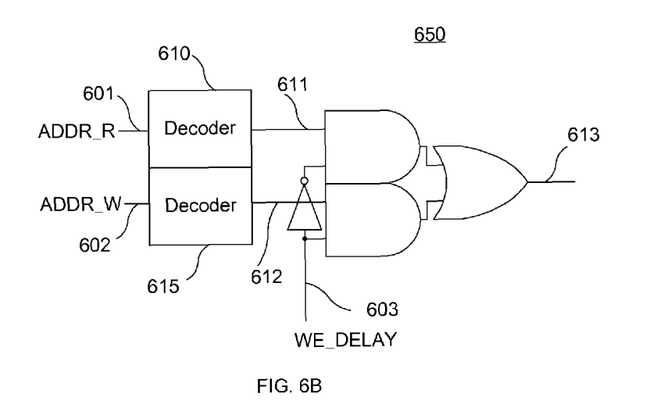
FIG. 6B illustrates an exemplary block diagram of an address decoder receiving two addresses and comprising two decoders to sequentially select one of the two addresses in one clock cycle consistent with the disclosed embodiments.

FIG. 6B illustrates an exemplary block diagram 650 of an address decoder receiving two addresses and comprising two decoders to sequentially select one of the two addresses in one clock cycle. The word lines for read 611 are decoded from ADDR_R 601 by a decoder 610, and the word lines for write 612 are decoded from ADDR_W 602 by a decoder 615.

Before the WE_DELAY 603 is enabled, the word line read selection signal 611 is outputted as target word lines 613 to allow reading from a particular target row. When WE_DELAY 603 is enabled, the word line write selection signal 612 is outputted as the target word lines 613 to allow writing to the target SRAM cell. Read and write operations may be targeted to different rows.

Figure 6C:
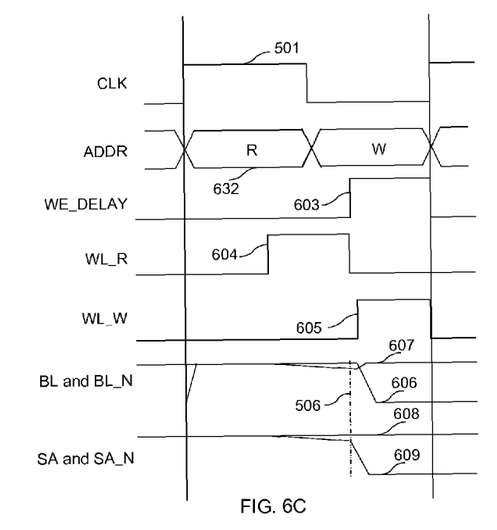
FIG. 6C illustrates an exemplary timing diagram of using one address decoder to increase the write bandwidth by adding a write operation during a read clock cycle consistent with the disclosed embodiments.

FIG. 6C illustrates an exemplary timing diagram of using one address decoder to increase the write bandwidth by adding a write operation during a read clock cycle. The sequential read and write operations are the same as in FIG. 6A, except that read and write addresses are inputted sequentially on one address bus ADDR 632. The read address is decoded from ADDR 632 before WL_R 604 is enabled, and later in the clock cycle, the write address is decoded from ADDR 632 before WL_W 605 is enabled. The read and write operations can be performed on the same SRAM cell (the read address and write address are the same) or on two different SRAM cells (the read address and write address are different from each other).

Operation is similar to FIG. 6A. In the embodiment where both read and write operations are done to the same cell, the data in the bit lines BL 606 and BL_N 607 are sensed and amplified to SA 608 and SA_N 609 at a time of 506 before the write operation refreshes the data. As a result, data originally existing in the SRAM cell has already been properly recorded from the SA, and other data are properly written to the BL as well. The SRAM array can read data first and then write data. Alternatively, the read can also be replaced with a write so that two write operations happen sequentially.

Figure 6D:
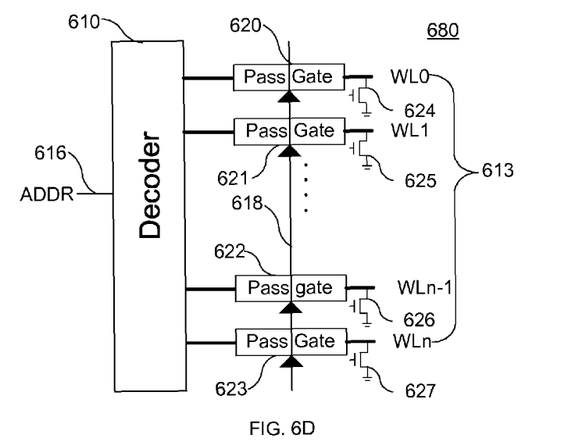
FIG. 6D illustrates an exemplary block diagram of an address decoder that comprises one decoder for sequentially decoding a write address and a read address from one address in one clock cycle consistent with the disclosed embodiments.

FIG. 6D illustrates an exemplary block diagram 680 of an address decoder that comprises one decoder for sequentially decoding a write address and a read address from one address ADDR 616 in one clock cycle as in FIG. 6C. As shown in FIG. 6D, decoder 610 is coupled to a plurality of pass gates, for example, pass gates 620, 621, 622 and 623, and an output end of each pass gate is connected to ground through a NMOS transistor. At the beginning of the clock cycle, bit lines are pre-charged, and the pass gates 620, 621, 622 and 623 are at first closed. The NMOS transistors 624, 625, 626 and 627 are enabled to set "0" to all word lines. A read address inputted through the address bus ADDR 616 is decoded by the decoder 610. The decoding results are passing through the pass gates 620, 621, 622 and 623 which are enabled by enable signal 618 to enable a word line in word lines 613 for reading. At the rising edge of WE_DELAY 603, the pass gates 620, 621, 622 and 623 are disabled and the NMOS transistors 624, 625, 626 and 627 are turned on again to discharge the word line previous charged for reading. Then the pass gates 620, 621, 622 and 623 are turned on again, this time passing the write word line selection signal generated by decoder 610 based on the write address on ADDR 632, to enable one of the word lines in 613 to select a row of memory cells for writing. Thus, write or read operations can be performed on SRAM cells on two different rows.

Figure 7:
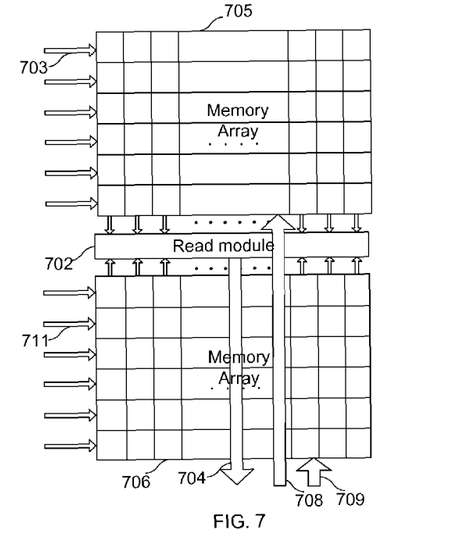
FIG. 7 illustrates a method for employing one read module to drive two SRAM arrays consistent with the disclosed embodiments.

A plural number of SRAM arrays may share one read (sensing) module 115 (as in FIG. 1B) to save chip area. FIG. 7 illustrates a method for employing one read module to serve two SRAM arrays. The bit lines of two separate SRAM arrays 705 and 706 having the same column address are multiplexed by an array multiplexer included in the read module 702. The array multiplexer is controlled by a select signal, selecting data on either bit lines 705 or 706 for sensing and amplifying. Within one clock cycle, a write operation may be performed on one of SRAM array 705 or 706 while either a write or a read operation may be performed on the other SRAM array 706 or 705. In one embodiment, both SRAM arrays are under write operations. One word line 703 in the SRAM array 705 is enabled, and data are written into the cells controlled by 703 through a write port 708; at the same time, another word line 711 is enabled in the SRAM array 706, and data are written into the cells controlled by word line 711 through a write port 709. In another embodiment, a read and a separate write operation are performed on the SRAM arrays 705 and 706, respectively. The word line 703 in the SRAM array 705 is enabled, and data in memory cells controlled by word line 703 are read out by a read module 702 to a read port 704; at the same time, the word line 711 is enabled in the SRAM array 706, and data are written into cells controlled by 711 through the write port 709. The write port can be either the normal or the wide bandwidth write port, and the read ports can be either the normal or the wide bandwidth read port.

The disclosed methods and systems may significantly enhance read/write bandwidth for memory arrays by using additional input and output ports and/or adjusting timing sequences for read and write operations. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

INDUSTRIAL APPLICABILITY

The disclosed devices and methods may be used in various applications in stand-alone memory devices and embedded memory devices in processors, SOC chips, computing systems, communication and other digital systems. For example, the disclosed devices and methods may be used in high performance processor cache applications, high-efficient data processing applications crossing multiple levels of memory hierarchy or even crossing multiple levels of networked systems.

The invention claimed is:
1. A memory device, comprising:
a first memory array containing a plurality of memory cells arranged in an array configuration;
a first read port configured to read first data from a single memory cell selected from a row of memory cells during a single reading cycle;
a second read port configured to synchronously read second data from unselected memory cells in the row of memory cells controlled by a common word line and in parallel;
a control input port to receive a mode signal indicating a functional mode for the memory device including a first read mode and a second read mode, wherein
when the mode signal indicates the first read mode, the first read port is used to read out the first data; and
when the mode signal indicates the second read mode, the first read port is used to read out the first data of the selected memory cell in the row of memory cells and the second read port is used to read out the second data of the unselected memory cells in the row of memory cells such that the entire row of memory cells are read out; and
a read module coupled to the first read port and the second read port, the read module including:
a first read module coupled to the row of memory cells for reading out the single memory cell during the first read cycle; and a second read module coupled to the row of memory cells for reading out the unselected memory cells in parallel.

2. The memory device according to claim 1, further including:
a write port configured to write data into the row of memory cells controlled by the common word line in parallel during the single writing cycle.

3. The memory device according to claim 1, further including:
when the mode signal indicates the second read mode, the first data are read out from the first read port during a first reading cycle, and the second data are read out from the second read port during a second reading cycle.

4. The memory device according to claim 1, further including:
a second memory array configured to share the read module with the first memory array such that an area of the memory device containing the first memory array and the second memory array is reduced.

5. The memory device according to claim 1, wherein:
the first read port operates at a higher speed than the second read port.

6. A memory device, comprising:
a memory array containing a plurality of memory cells arranged in an array configuration;
a first write port configured to write first data into a single memory cell during a single writing cycle; and
a second write port configured to write second data into a group of memory cells controlled by a common word line during the single writing cycle,
a control input port to receive a mode signal indicating a functional mode for the memory device including a first write mode and a second write mode,
when the mode signal indicates the first write mode, the first write port is used to write the first data;
when the mode signal indicates the second write mode, the second write port is used to write the second data;
a first read port configured to read data from a selected single memory cell from a row of memory cells during a single reading cycle;
a second read port configured to synchronously read data from unselected memory cells in the row of memory cells controlled by a common word line; and
a read module coupled to the first read port and the second read port, the read module including:
a first read module coupled to the row of memory cells for reading out the single memory cell during the first read cycle; and
a second read module coupled to the row of memory cells for reading out the unselected memory cells in parallel.

7. A memory device, comprising:
a single-port memory array configured to receive word lines and bit lines, the memory array comprising a first number of rows and a second number of columns of memory cells, each row being controlled by a word line, each column being connected by a bit line and a complementary bit line for a first functional mode, every third number of adjacent columns being grouped as a logical column corresponding to a bit of data and every third number of adjacent memory cells on one row being grouped as a memory cell unit for a second functional mode;
an address decoder configured to receive an address bus and to generate a word line and a column select signal;
a read/write control module configured to receive control signals to generate a write mode control, a write enable and a read enable;
a write module configured to receive the write mode control, the write enable, a column address, a first write input under the first functional mode and a second write input under the second functional mode and to connect to drive the bit lines and complementary bit lines, the write module selecting one or more sets of the third number of bit lines and complementary bit lines in every logic column to be written; and
a read module coupled to a first read port and a second read port and configured to receive the read enable, the column address, the bit lines and the complementary bit lines and to generate a first read output from a single memory cell selected from a row of memory cells during a single reading cycle and a second read output from unselected memory cells in the row of memory cells controlled by a common word line, the read module multiplexing the third number of bit lines and complementary bit lines in every logic column.

8. The memory device according to claim 7, wherein:
the second functional mode is a wide bandwidth write mode, and the memory device further includes a wide bandwidth write module controlled by the write mode control to refresh the third number of bit lines in one logic column with the wide bandwidth write input, the word line and the logic column being controlled by the address decoder.

9. The memory device according to claim 7, wherein the read module further comprises:
a high-speed read module to generate the first read output.

10. The memory device according to claim 9, wherein the wide bandwidth read module further comprises:
a plurality of low-speed read modules to generate the second read output, and each column of memory cells has a corresponding low-speed read module.

11. The memory device according to claim 10, wherein:
the second functional mode is a wide bandwidth read mode, and data in one memory cell in a selected memory cell unit is read out to the first read port by the high-speed read module, and data in all memory cells in the selected memory cell unit are subsequently read out in parallel by the low-speed read modules to the second read port.

12. The memory device according to claim 10, wherein:
the first functional mode is a sequential read mode, and data in one memory cell in a selected memory cell unit are outputted through the first read port by the high-speed read module, and the data in the other memory cells in the selected memory cell unit are subsequently read by the low-speed read module and stored in the read register module for outputting to the second read port sequentially.

* * * * *